US008594755B1

(12) United States Patent
Tages et al.

(10) Patent No.: US 8,594,755 B1
(45) Date of Patent: Nov. 26, 2013

(54) MOBILE DEVICE CASE WITH A SCREEN PROTECTOR

(75) Inventors: Fernando Tages, Coral Springs, FL (US); Alan Kleinman, Davie, FL (US); Daniel Acero, Coral Springs, FL (US); Jorge Sotelo, Doral, FL (US)

(73) Assignee: A.G. Findings & Mfg. Co., Inc., Fort Lauderdale, FL (US)

( * ) Notice: Subject to any disclaimer, the term of this patent is extended or adjusted under 35 U.S.C. 154(b) by 0 days.

(21) Appl. No.: 13/523,197

(22) Filed: Jun. 14, 2012

Related U.S. Application Data

(60) Provisional application No. 61/642,100, filed on May 3, 2012.

(51) Int. Cl.
*H04M 1/00* (2006.01)

(52) U.S. Cl.
USPC ............... 455/575.8; 455/550.1; 455/575.1; 455/575.4; 206/305; 206/304.2; 206/471; 206/521

(58) Field of Classification Search
USPC ............... 455/550.1, 575.1, 575.4, 575.8; 206/701, 304.2, 305, 521, 471
See application file for complete search history.

(56) References Cited

U.S. PATENT DOCUMENTS

| | | | |
|---|---|---|---|
| 2,004 A | 3/1841 | Harris et al. | |
| 89,570 A | 5/1869 | Fellows | |
| 4,006,764 A | 2/1977 | Yamamoto et al. | |
| 4,584,718 A | 4/1986 | Fuller | |
| 4,703,161 A | 10/1987 | McLean | |
| 5,025,921 A | 6/1991 | Gasparaitis et al. | |
| 5,175,873 A | 12/1992 | Goldenberg et al. | |
| 5,386,084 A | 1/1995 | Risko | |
| 5,586,002 A | 12/1996 | Notarianni | |
| 5,713,466 A | 2/1998 | Tajima | |
| 5,812,188 A | 9/1998 | Adair | |
| 5,990,874 A | 11/1999 | Tsumura et al. | |
| 5,996,790 A | 12/1999 | Yamada et al. | |
| 6,031,524 A | 2/2000 | Kunert | |
| 6,052,279 A | 4/2000 | Friend et al. | |
| 6,138,826 A | 10/2000 | Kanamori et al. | |
| 6,317,313 B1 | 11/2001 | Mosgrove et al. | |
| 6,349,824 B1 | 2/2002 | Yamada | |
| 6,415,138 B2 | 7/2002 | Sirola et al. | |
| 6,426,870 B1 | 7/2002 | Oross et al. | |
| 6,525,928 B1 | 2/2003 | Madsen et al. | |
| 6,532,152 B1 | 3/2003 | White et al. | |
| 6,536,589 B2 | 3/2003 | Chang | |
| 6,608,119 B2 | 8/2003 | Tanabe et al. | |
| 6,646,864 B2 | 11/2003 | Richardson | |
| 6,646,866 B2 | 11/2003 | Kao | |
| 6,659,274 B2 | 12/2003 | Enners | |
| 6,721,651 B1 | 4/2004 | Minelli | |
| 6,785,566 B1 | 8/2004 | Irizarry | |
| 6,844,845 B1 | 1/2005 | Whiteside et al. | |
| 6,896,134 B2 | 5/2005 | Russell et al. | |
| 6,983,130 B2 | 1/2006 | Chien et al. | |
| 6,995,976 B2 | 2/2006 | Richardson | |
| 7,069,063 B2 | 6/2006 | Halkosaari et al. | |
| 7,130,185 B2 | 10/2006 | Chen et al. | |

(Continued)

*Primary Examiner* — Khalid Shaheed
(74) *Attorney, Agent, or Firm* — Christopher & Weisberg, P.A.

(57) ABSTRACT

A mobile device case including a housing sized to retain a mobile device. A screen protector removeably engageable with a portion of the housing is included, the screen protector including an engagement element at least partially concealable insertable within a portion of the housing.

15 Claims, 6 Drawing Sheets

(56) References Cited

U.S. PATENT DOCUMENTS

| | | |
|---|---|---|
| 7,158,376 B2 | 1/2007 | Richardson et al. |
| 7,180,735 B2 | 2/2007 | Thomas et al. |
| 7,230,823 B2 | 6/2007 | Richardson et al. |
| 7,312,984 B2 | 12/2007 | Richardson et al. |
| 7,609,512 B2 | 10/2009 | Richardson et al. |
| 7,684,178 B2 * | 3/2010 | Hsu et al. .................. 361/679.21 |
| D615,535 S | 5/2010 | Richardson et al. |
| 7,907,394 B2 | 3/2011 | Richardson et al. |
| 8,204,561 B2 | 6/2012 | Mongan et al. |
| 2002/0137475 A1 | 9/2002 | Shou et al. |
| 2003/0217940 A1 | 11/2003 | Russell et al. |
| 2004/0089570 A1 | 5/2004 | Chien et al. |
| 2005/0130721 A1 * | 6/2005 | Gartrell ...................... 455/575.8 |
| 2005/0139498 A1 | 6/2005 | Goros |
| 2009/0009945 A1 * | 1/2009 | Johnson et al. ................ 361/681 |
| 2010/0008028 A1 * | 1/2010 | Richardson et al. ...... 361/679.01 |
| 2010/0197369 A1 * | 8/2010 | Mourali et al. ............. 455/575.1 |
| 2010/0200456 A1 * | 8/2010 | Parkinson ..................... 206/701 |
| 2011/0226545 A1 | 9/2011 | Richardson et al. |
| 2011/0228458 A1 | 9/2011 | Richardson et al. |
| 2011/0228459 A1 | 9/2011 | Richardson et al. |

\* cited by examiner

MOBILE DEVICE CASE WITH A SCREEN PROTECTOR

This application is related to and claims priority to U.S. Provisional Application Ser. No. 61/642,100, filed May 3, 2012, entitled MOBILE DEVICE CASE WITH A SCREEN PROTECTOR, the entirety of which is incorporated herein by reference.

FIELD

Background

Mobile devices, and in particular, mobile phones and tablet computers, have become more technology advanced, and as a result, more valuable, as these devices often include a myriad of expensive and fragile components. To protect these mobile devices from damage owing to impact forces, protective mobile device cases have been devised to cushion as well as to conform to the mobile device.

Available protective mobile device cases often include a rigid or cushioned material in which the mobile device is inserted and which surrounds at least a portion of the mobile device. Other materials may be included to cushion various components of the mobile device or to provide a barrier to elements such as dust or water. In particular, flaps may be included on an outer silicone layer of the case and sized to engage an inner rigid layer to protect the various apertures on the mobile device, such as headphone and power ports.

Another typical feature of mobile device cases is a thin film affixed to the mobile device case or affixed directly to a touch screen of a mobile device to protect the touch screen from dust and the like. These films offer some scratch protection, however, such protective films either offer little or no impact protection to the touch screen, as these films are highly flexible or made of non-rigid materials. Moreover, such films are either affixed to the mobile device case or the mobile device itself and thus are difficult if not impossible to remove without damaging the film or the case.

SUMMARY

The present invention advantageously provides for a mobile device case including a housing sized to retain a mobile device. A screen protector removeably engageable with a portion of the housing is included. The screen protector includes an engagement element at least partially concealably insertable within a portion of the housing.

In another embodiment, the mobile device case includes a unitary housing sized to retain a mobile device in which the housing defines a groove. A substantially rigid screen protector defining a lip is included. At least a portion of the lip is retainable within the groove.

In yet another embodiment, the mobile device case includes a unitary housing sized to retain a mobile device and a groove. A transparent screen protector has a substantially planar surface. The screen protector includes a lip extending a predetermined distance away from the planar surface of the screen protector. At least a portion of the lip is retained within the groove. The screen protector includes a ridge sized to contour a portion of the mobile device extending in a direction substantially opposite a direction to which the lip extends. A shell sized to be at least partially received within a portion of the housing is included, the shell operating to secure the screen protector to the housing.

BRIEF DESCRIPTION OF THE DRAWINGS

A more complete understanding of the present invention, and the attendant advantages and features thereof, will be more readily understood by reference to the following detailed description when considered in conjunction with the accompanying drawings wherein.

DETAILED DESCRIPTION

Figure 1:
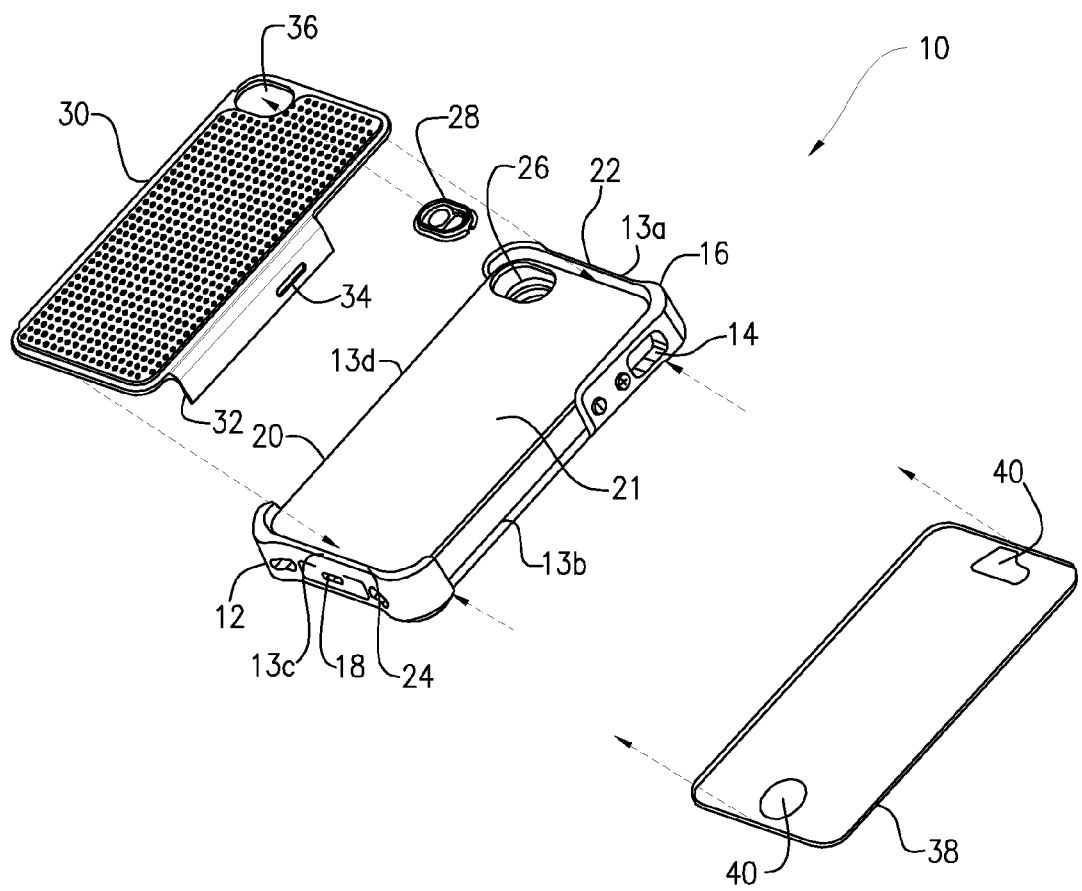
FIG. 1 is a disassembled view of a mobile device case constructed in accordance with the principles of the present invention.

Now referring to the drawings in which like reference designators refer to like elements, there is shown in FIG. 1 a mobile device case designated generally as "10." The case 10 may include a housing 12 sized to receive and/or retain a mobile device. For example, the housing 12 may be sized to retain and at least partially conform to an IPHONE 4/4S or other makes and models of electronic mobile devices. In an exemplary embodiment, the housing 12 is a unitary one-piece structure composed of a flexible material, for example, silicone or a material with a durometer of approximately 60 A, or may be composed of a flexible material with a higher or lower durometer than silicone.

The housing 12 may include a plurality of side portions having a height sufficient to retain the mobile device. For example, the housing 12 may define four side portions 13, designated 13a, 13b, 13c, and 13d, sized to retain an IPHONE 4/4S. Alternatively, the housing 12 may be a two-piece clam shell structure. The housing 12 may include one or more openings 14 sized to facilitate access to various controls of the mobile device, for example, a mute switch, on/off switch, volume controls, and the like. The housing 12 may further define protrusions or other portions that contour and conceal within the housing 12 the various controls of the mobile device, for example, volume buttons or other actuators of the mobile device. The housing 12 may further include corner portions 16 that are substantially bulbous and protrude a distance away from the housing. In particular, the corner portions 16 may be sized such that should the device be dropped and experience an impact force from a surface, the corner portions 16 may contact the surface before the remainder of the housing 12 contacts the surface.

The housing 12 may further include one or more plugs 18 that may be die or laser cut into the housing 12. The plugs 18 may be movably coupled to the housings 12 such that when they are in a first position, they are substantially flush with an outer surface of the housing 12; when the plugs 18 are in a second position, they extend distance outward from the housing 12; and when the plugs 18 are in a third position, they extend inward to the interior of the housing 12 and are sized to be removeably inserted within a portion of the mobile device. For example, as shown in FIG. 1, the plug 18 may be sized to directly fill a plug port on a mobile device. Other plugs 18, such as a headphone jack plug may also be included and be directly insertable within a portion of the mobile device.

Continuing to refer to FIG. 1, the housing 12 may define a planar recessed portion 20 on a back portion of the housing 12. In particular, the planar recessed portion 20 may be defined along a portion of the housing 12 in which the mobile device is not inserted, for example, back portion 21. In particular, the planar recessed portion 20 may be defined between a first raised side 22 and a second raised side 24. The first raised side 22 and the second raised side 24 may each include a one or more of the corner portions 16 and may further extend along a substantially orthogonally disposed side of the housing 12 to provide a raised surface for other features of the housing 12. For example, the first raised side 22 may extend along side portion 13b of the housing 12 that defines the volume controls and/or includes one or more openings 14. Accordingly, in an exemplary embodiment, the planar recessed portion 20 may extend along more than one surface of the housing 12, for example, along the back portion 21 and along side portion 13b of the housing 12.

Figure 2:
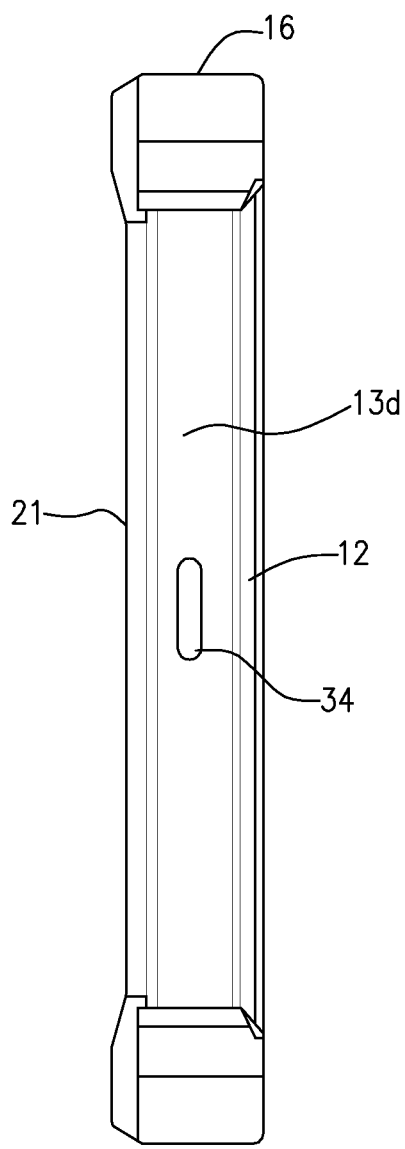
FIG. 2 is a side view of the assembled mobile device case shown in FIG. 1.

As shown in FIG. 1, the planar recessed portion 20 spans the distance between two corner portions 16 side 13b of the housing 12, and on the opposite side portion 13d, the planar recessed portion 20 spans a portion of the distance between two corner portions 16, as shown in FIG. 2. The planar recessed portion 20 of the housing 12 may further define an aperture 26 sized to receive a camera module 28. The camera module 28 provides a physical barrier between a flash and image capture feature of the mobile device camera.

Continuing to refer to FIG. 1, a substantially rigid shell 30 may be included with the device case 10, the shell 30 being sized to be received within the recess 20 of the housing 12. The shell 30 may be a unitary structure that form fits within the recess 20 between the first raised side 22 and the second raised side 24 such that the corners 16 are exposed. In particular, the shell 30 may be substantially composed of polycarbonate or other substantially rigid materials, such that when the shell 30 is received within the silicone recess 20, the shell 30 is removeably affixed to the housing 12. The shell 30 may further include at least one extension 32, on either or both sides of the shell 30 that engage a portion of the sides of the planar recessed portion 20. The extension 32 may define a slot 34 sized to receive a portion of a holster (not shown) such that the housing 12 and the shell 30 may be coupled to the holster. The extension 32 may further operate to squeeze a portion of housing 12 within the shell 30 such that the housing 12 is tightly engaged to shell 30. The extension 32 may further include a tab or other fastening element (not shown) that engages a portion of the housing 12 to further provide for the releasable attachment of the shell 30 to the housing 12.

The shell 30 may also include materials such as TPU, silicone, or the like to provide resiliency to the shell 30 during an impact event. For example, the shell 30 may include a layer of TPU on some or all of an outer portion and/or inner portion of the shell 30 to provide a cushioned layer during an impact event. The shell 30 may also include a shell aperture 36 to which the camera module 28 may be releasably attached.

Figure 3:
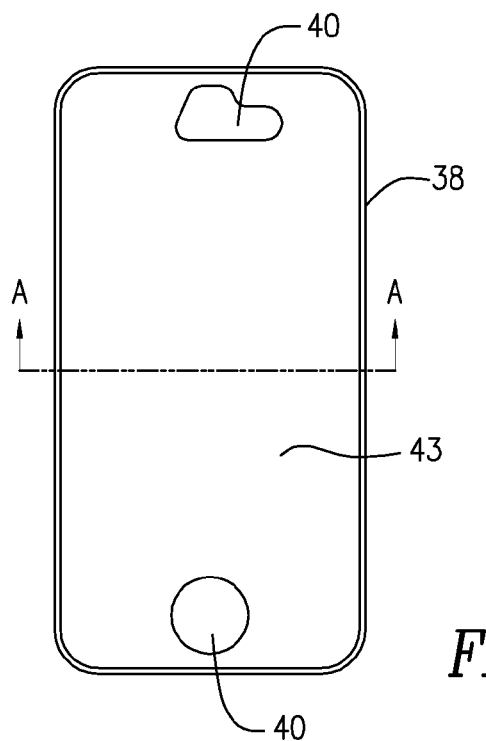
FIG. 3 is a top view of the screen protector shown in FIG. 1.

Now referring to FIGS. 1 and 3, a screen protector 38 is releasably engageable to the housing 12. The screen protector 38 may be sized to fit over a display, whether touch screen or non-touch screen, of a mobile device. In particular, the screen protector 38 may be sized to at least substantially cover a face of the mobile device that includes the display. Alternatively, the screen protector 38 may be sized to exclusively cover the display of the mobile device, while a keypad or other push-button features are left uncovered by the screen protector 38.

The length and width of the screen protector 38 may be substantially commensurate with the length and width of the mobile device. For example, the length and width of the screen protector 38 may be substantially same or slightly larger than the length and width of the mobile device to be retained with the case 10. The screen protector 38 may be composed of a substantially rigid and transparent material, for example, polycarbonate, and may include electrical properties such that the controls of the touch screen of the mobile device are actuable through the screen protector 38. The screen protector 38 may be sufficiently thick, for example, approximately a millimeter or more, such that it is substantially rigid. The screen protector 38 may further define one or more screen protector apertures 40 sized to provide access to one or more controls on the mobile device, for example, an on/off or home switch, and to provide access to speakers.

Figure 4:
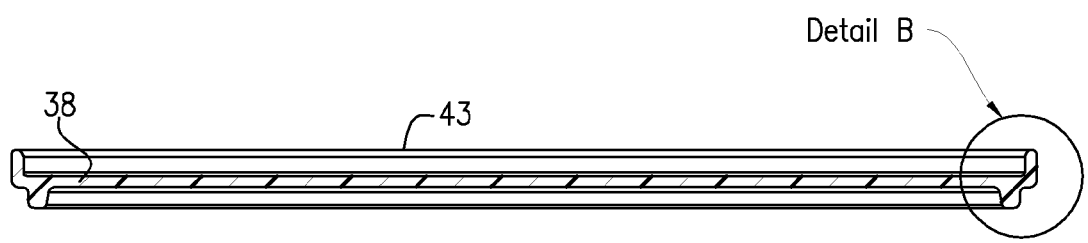
FIG. 4 is a cross-sectional view through Section A-A in FIG. 3.
Figure 5:
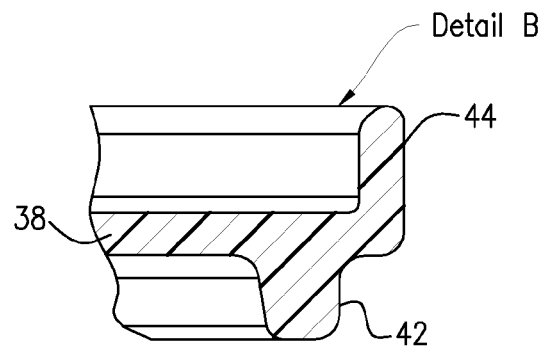
FIG. 5 is a side cross-sectional view of Detail B shown in FIG. 4.

Referring now to FIGS. 4 and 5, the screen protector 38 includes an engagement element 42 extending and protruding around at least a portion of the screen protector 38. The engagement element 42 may be a lip or other element that releaseably engages with a portion of the housing 12. The lip 42 may be composed of substantially the same material as that of the screen protector 38 and may extend in a direction substantially orthogonal to the major plane surface 43 of the screen protector 38. For example, as shown in FIG. 4, the screen protector 38 may define a substantially planar portion. The lip 42 may be included around an entire, or substantially an entire, portion of a perimeter region defined by the screen protector 38 and may extend vertically in a substantially perpendicular direction from the screen protector 38. For example, as shown in FIG. 1, the lip 42 extends around the entire perimeter region. In an exemplary embodiment, the lip 42 extends approximately two millimeters away from a surface 43 of the screen protector 38 and may be approximately two millimeters in width. The lip 42 may be substantially uniform in shape or alternatively may taper in width as it extends outward from the surface 43 of the screen protector 38.

A ridge 44 is disposed at a position distal the lip 42 and extends in a direction opposite to that of the lip 42 and substantially orthogonal to the planar surface 43 of screen protector 38. The ridge 44 may be thinner than the lip 42 and may define a contact surface sized and contoured to match the contour of the particular mobile device to which the screen protector 38 is to be engaged. The ridge 44 may extend around at least a portion of the screen protector 38 at a position distal to the lip 42 such that the ridge 44 is positioned a distance away from the outer edge of the mobile device when the mobile device is retained within the housing 12. In other embodiments, the lip 42 and the ridge 44 are included along the same vertical axis, and in other embodiments, the lip 42 is included at a position proximal the ridge 44. In an exemplary embodiment, the ridge 44 and the planar surface 43 of the screen protector 38 cooperate to snap-fit over the side portion of a mobile device or alternatively may be slid into position over the touch screen. For example, the screen protector 38 may be snapped into position over the mobile device or alternatively may be slid into place depending on the contour of the ridge 44. Of note, although the embodiment is described with reference to a planar surface 43, the invention is not limited to such. It is contemplated that the surface 43 need not be flat and can have some curvature as long as operation of an enclosed mobile device is not hindered.

Figure 6:
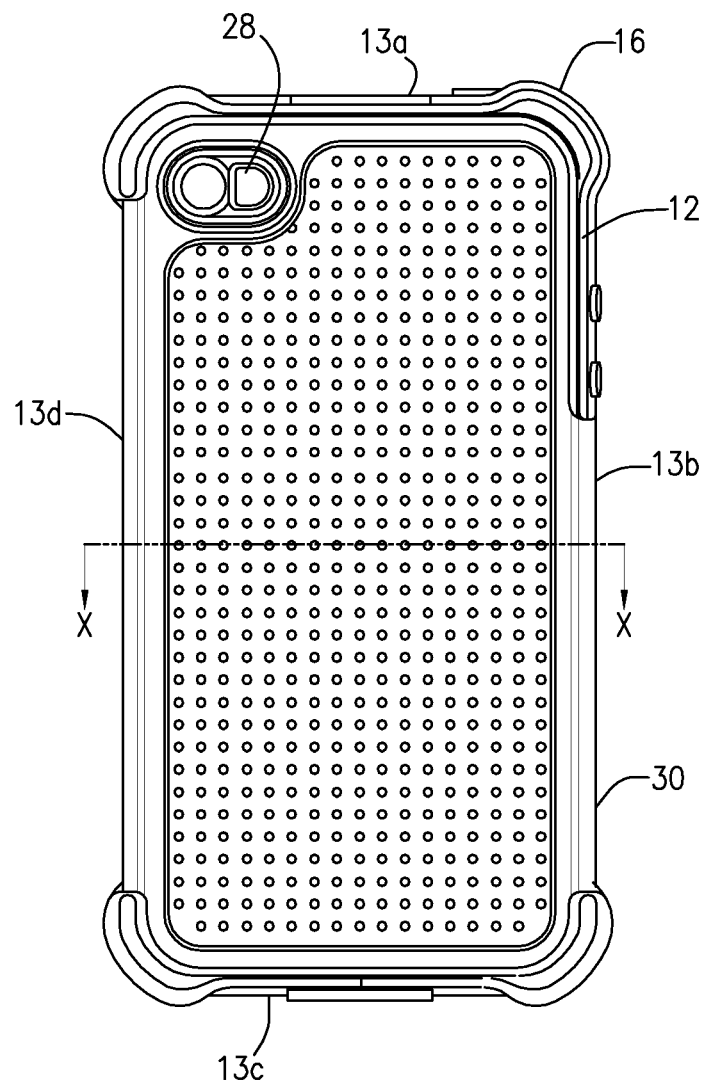
FIG. 6 is a back view of the assembled mobile device case shown in FIG. 1.
Figure 7:
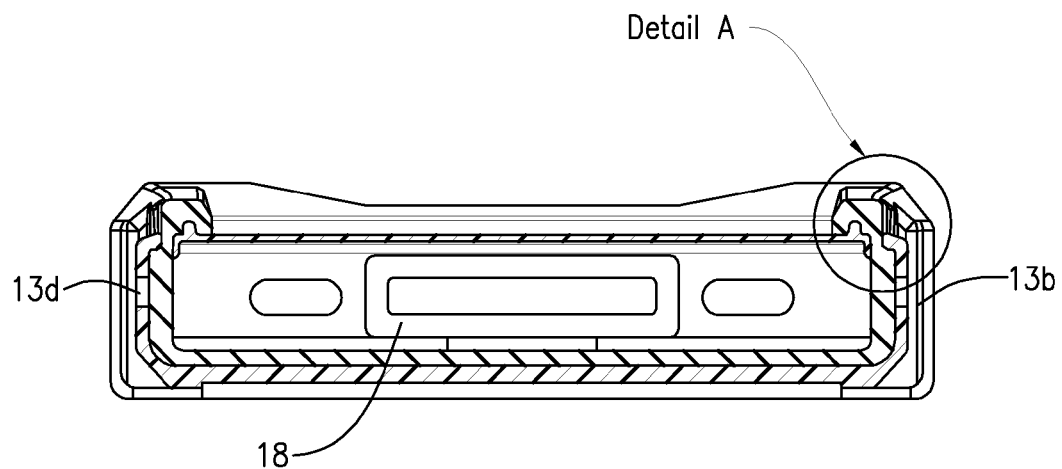
FIG. 7 cross-sectional view through Section X-X of the mobile device case shown in FIG. 6.
Figure 8:
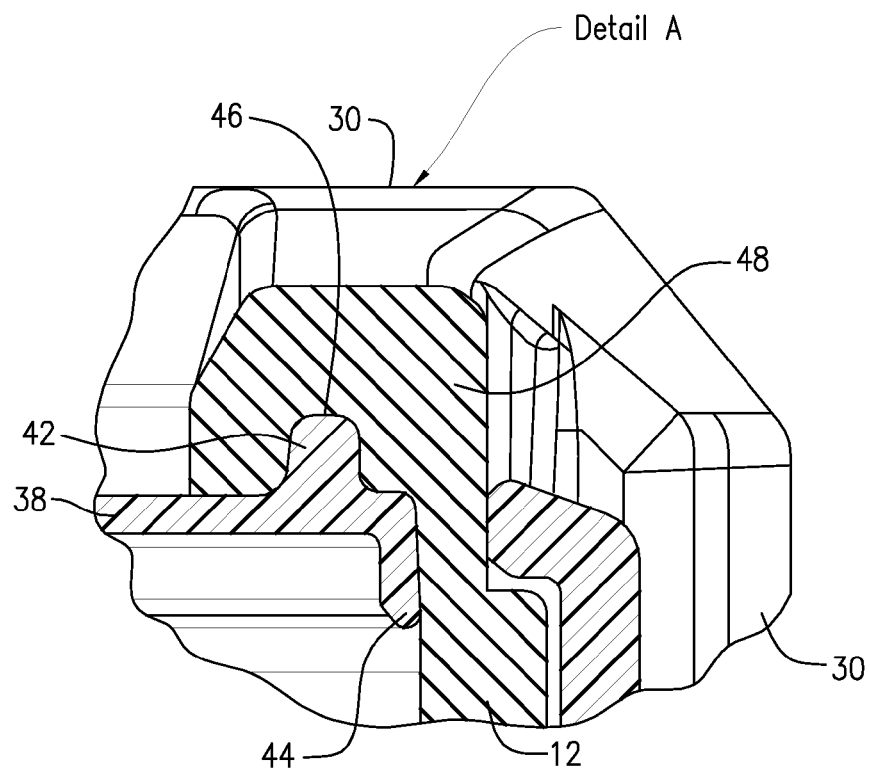
FIG. 8 is a side cross-sectional view of Detail A shown in FIG. 7.

Now referring to FIGS. 6-8, the housing 12 includes a groove 46 (best seen in FIG. 8) sized to receive and substantially conceal at least a portion of the lip 42. In particular, a portion of the housing 12 contouring the side portions of the mobile device when retained with the housing 12, may extend to a height greater than the height of the mobile device, such that a portion of the housing 12 extends a distance above the screen protector 38 and the lip 42. This extended portion of the housing 12 may be molded to otherwise bend inward toward the interior of the housing 12 to define a screen protector receiving portion 48. In an exemplary embodiment, the screen protector receiving portion 48 may have a substantially curved or hook-like shape and span the length of each of the side portions of the housing 12. It is contemplated, however, that the screen protector receiving portion 48 may span any portion, or all, of the housing 12 including any side portion of the housing 12, and may extend entirely or partially along any of the side portions of the housing 12. In the embodiment shown in FIG. 7, the screen protector receiving portion 48 is disposed along at least two side portions of the housing 12 that define the length of the housing 12.

A portion of the screen protector receiving portion 48 may be positionable on a first side of the lip 42 and another portion of the screen protector receiving portion 48 may be positionable on a second side of the lip 42 with the groove 46 defined there between. The groove 46 may be sized such that the lip 42 is friction fit within the groove 46, such that the screen protector 38 is restricted from moving laterally when the lip 42 is disposed within the groove 46. In an embodiment, the screen protector 38 may be movable longitudinally along its major axis when the lip 42 is disposed within the groove 46 such that it may be slideably removed separated from the housing 12. In another embodiment, the screen protector 38 may be removed only when the screen protector receiving portion 48 is disengaged from the lip 42 by, for example, folding the screen protector receiving portion 48 back.

Referring to FIG. 8, another portion of the screen protector receiving portion 48 may abut the ridge 44 when the lip 42 is disposed within the groove 46, which may operate to prevent the screen protector 38 from moving when installed, and may further operate to prevent a lateral force from being transferred to the screen protector 38. Moreover, because the screen protector receiving portion 48 is raised from the surface 43 of the screen protector 38, it operates to cushion the screen protector in the event of the mobile device case 10 being dropped. The screen protector receiving portion 48 may further be sized to partially be disposable within a portion of the shell 30 when the shell 30 is disposed within the recess 20 or within a portion of the housing 12, such that the shell 30 operates to secure the screen protector 38 to the housing 12. In particular, the screen protector receiving portion 48 may define a curvature such that a portion of the screen protector receiving portion 48 contours a portion of an interior portion of the corner portions 16 or an interior portion of the shell 30.

Figure 9:
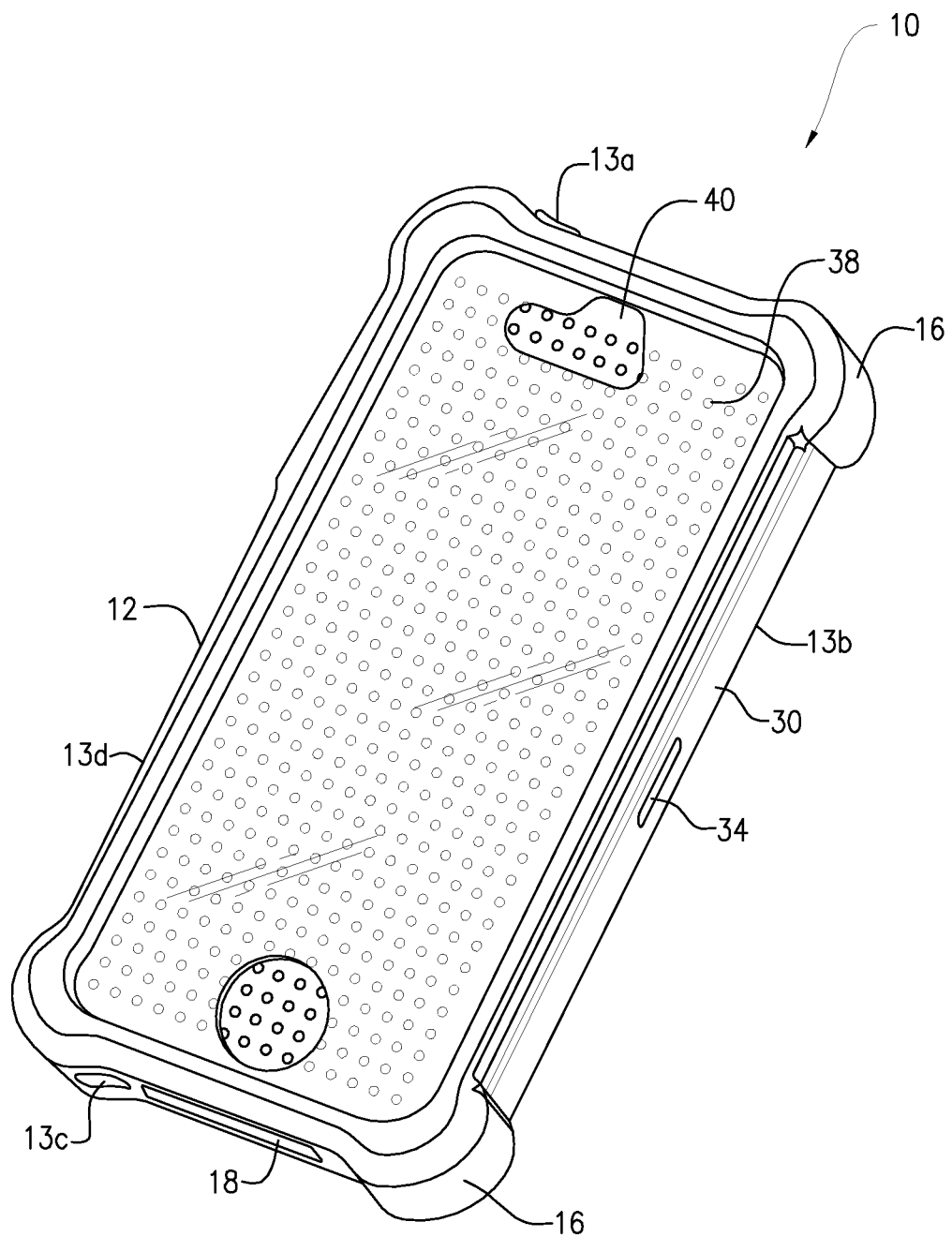
FIG. 9 is a front perspective view of the assembled mobile device case shown in FIG. 1.

Now referring to FIG. 9, the screen protector 38 may be disposed within the housing 12 such that it is recessed beneath at least a portion of the perimeter of the housing 12. As such, should the case 10 be dropped on the face of the housing 12 including the screen protector 38, the housing 12 may impact a surface first to shield the screen protector 38 from impact. Additionally, when the screen protector 38 is engaged to the housing 12, the lip 42, ridge 44, and groove 46 may be substantially concealed by portions of the housing 12.

To remove the screen protector 38 from the housing 12, the shell 30 may be removed from the planar recessed portion 20 by, for example, pressing on the sides of the corners 16 of the housing 12 and pulling the shell 30 off of the housing 12. The screen protector receiving portion 48 may then be folded or otherwise manipulated such that the lip 42 is disengaged from the groove 46. The screen protector 38 may then be pulled or slid off the mobile device.

It will be appreciated by persons skilled in the art that the present invention is not limited to what has been particularly shown and described herein above. In addition, unless mention was made above to the contrary, it should be noted that all of the accompanying drawings are not to scale. A variety of modifications and variations are possible in light of the above teachings without departing from the scope and spirit of the invention, which is limited only by the following claims.

What is claimed is:

1. A mobile device case for retaining a mobile device, the mobile device case comprising:
    a housing defining an interior dimensioned to releasably retain the mobile device;
    an at least substantially planar screen protector removeably engageable with a portion of the housing, the at least substantially planar screen protector including:
        an at least substantially planar portion;
        an engagement element at least partially concealably insertable within a portion of the housing, the engagement element being a lip, the lip protruding in a direction substantially orthogonal to the at least substantially planar portion;
        a ridge protruding a predetermined distance away from the at least substantially planar portion, the ridge being positioned proximal to the lip; and
    the housing including a groove sized to receive at least a portion of the lip.

2. The mobile device case of claim 1, wherein the housing is comprised of a silicone gel.

3. The mobile device case of claim 1, wherein the at least substantially planar screen protector is comprised of polycarbonate.

4. The mobile device case of claim 1, wherein the ridge extends in a direction substantially opposite of the direction the lip extends and is sized to contour a portion of the mobile device.

5. The mobile device case of claim 1, wherein the at least substantially planar screen protector includes at least one aperture.

6. The mobile device case of claim 1, further comprising a substantially rigid shell engageable with the housing.

7. The mobile device case of claim 6, wherein the shell is arranged to secure the at least substantially planar screen protector to the housing.

8. The mobile device case of claim 1, wherein the housing defines at least one flap sized to be directly received within a corresponding port on the mobile device.

9. A mobile device case for releasably retaining a mobile device, the mobile device case comprising:
    a unitary housing including a groove and defining an interior having a length, the housing sized to releasably retain the mobile device;
    a substantially rigid, transparent and at least substantially planar screen protector having:
        a perimeter region;
        a lip, the lip being disposed around the perimeter region, at least a portion of the lip being retainable within the groove;
        a ridge extending in a direction substantially opposite a direction to which the lip extends; and
    the substantially rigid, transparent at least substantially planar screen protector having a length that is substantially the same as the length of the interior of the housing.

10. The mobile device case of claim 9, wherein the housing defines a recessed portion, and wherein the mobile device case further includes a substantially rigid shell sized to be at least partially received within the recessed portion.

11. The mobile device case of claim 10, wherein the shell is arranged to secure the substantially rigid, transparent at least substantially planar screen protector to the housing.

12. The mobile device case of claim 9, wherein the substantially rigid, transparent at least substantially planar screen protector has at least one aperture.

13. The mobile device case of claim 9, wherein the substantially rigid, transparent at least substantially planar screen protector is comprised of polycarbonate.

14. The mobile device case of claim 9, wherein the housing defines at least one flap sized to be directly received within a corresponding port on the mobile device.

15. A mobile device case for retaining a mobile device, comprising:

a unitary housing defining a groove and having:
   a length; and
   an interior sized to releasably retain the mobile device;
an at least substantially planar and transparent screen protector extending substantially the entire length of the unitary housing and having:
   an at least substantially planar portion;
   a lip extending a predetermined distance away from the at least substantially planar portion, at least a portion of the lip being retainable within the groove;
   a ridge sized to contour a portion of the mobile device, the ridge extending in a direction substantially opposite a direction to which the lip extends; and
a shell sized to be at least partially received within a portion of the housing, the shell arranged to secure the at least substantially planar and transparent screen protector to the housing.

* * * * *